(12) United States Patent
Nakahara et al.

(10) Patent No.: US 12,733,430 B2
(45) Date of Patent: Sep. 8, 2026

(54) SEMICONDUCTOR MANUFACTURING APPARATUS

(71) Applicant: Kioxia Corporation, Tokyo (JP)

(72) Inventors: Taishi Nakahara, Kuwana Mie (JP); Takeori Maeda, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 188 days.

(21) Appl. No.: 18/830,978

(22) Filed: Sep. 11, 2024

(65) Prior Publication Data

US 2025/0246458 A1 Jul. 31, 2025

(30) Foreign Application Priority Data

Jan. 25, 2024 (JP) ................................ 2024-009768

(51) Int. Cl.
*H10P 72/00* (2026.01)

(52) U.S. Cl.
CPC ...... *H10P 72/0446* (2026.01); *H10P 72/0616* (2026.01)

(58) Field of Classification Search
CPC ............. H10P 72/7612; H10P 72/0616; H10P 72/0446; H10P 72/78; H10P 72/7624; H10P 72/7621
USPC .......................................................... 156/363
See application file for complete search history.

(56) References Cited

U.S. PATENT DOCUMENTS 8,561,664 B2 * 10/2013 Maki .................. H10P 72/0442 156/707
2002/0069952 A1 6/2002 Kurosawa
2006/0166466 A1 7/2006 Maki et al.
2006/0252233 A1 11/2006 Honma et al.
2007/0275544 A1 11/2007 Maki et al.
2009/0000109 A1 1/2009 Ozono et al.
2009/0279995 A1 11/2009 Haji et al.
2013/0071220 A1 3/2013 Kuroda
2013/0071956 A1 3/2013 Nakajima et al.
2014/0060751 A1 3/2014 Yamamoto et al.
2015/0214088 A1 7/2015 Nakao et al.
2018/0226281 A1 8/2018 Sogou et al.
2019/0295878 A1 9/2019 Arai et al.

(Continued)

FOREIGN PATENT DOCUMENTS

JP 2003109979 A 4/2003

*Primary Examiner* — James D Sells
(74) *Attorney, Agent, or Firm* — Holtz, Holtz & Volek PC

(57) ABSTRACT

A semiconductor manufacturing apparatus according to the present embodiment includes a push-up device, a transfer device, an electronic component holding device, and a mounting device. The push-up device is capable of pushing up a plurality of adjacent electronic components among a plurality of electronic components diced from a wafer. The transfer device is capable of transferring the plurality of electronic components pushed up by the push-up device. The electronic component holding device is capable of holding the plurality of electronic components transferred by the transfer device. At least part of the push-up device is capable of pushing up the plurality of adjacent electronic components by spanning the adjacent electronic components on the same surface. The electronic component holding device is capable of switching, for each of the electronic components, a holding state of the electronic component and a non-holding state of the electronic component.

17 Claims, 18 Drawing Sheets

(56) References Cited

U.S. PATENT DOCUMENTS

| | | | |
|---|---|---|---|
| 2019/0355602 | A1 | 11/2019 | Hayakawa |
| 2021/0265302 | A1 | 8/2021 | Mayr et al. |
| 2023/0178394 | A1 | 6/2023 | Ishimoto et al. |
| 2023/0197476 | A1 | 6/2023 | Ueno et al. |
| 2023/0223303 | A1 | 7/2023 | Mori et al. |

* cited by examiner

C
DT
12
SUCTION
SUCTION
11

31
S
C

SEMICONDUCTOR MANUFACTURING APPARATUS

CROSS REFERENCE TO RELATED APPLICATION

This application is based upon and claims the benefit of priority from the prior Japanese Patent Application No. 2024-009768, filed on Jan. 25, 2024, the entire contents of which are incorporated herein by reference.

FIELD

The embodiments of the present invention relate to a semiconductor manufacturing apparatus.

BACKGROUND

It is effective to employ a multi-stage push-up scheme when thin chips (thin electronic components) are picked up. However, it becomes difficult to produce jigs for the multi-stage push-up scheme when each chip has a large aspect ratio and is narrow.

DETAILED DESCRIPTION

Figure 1:
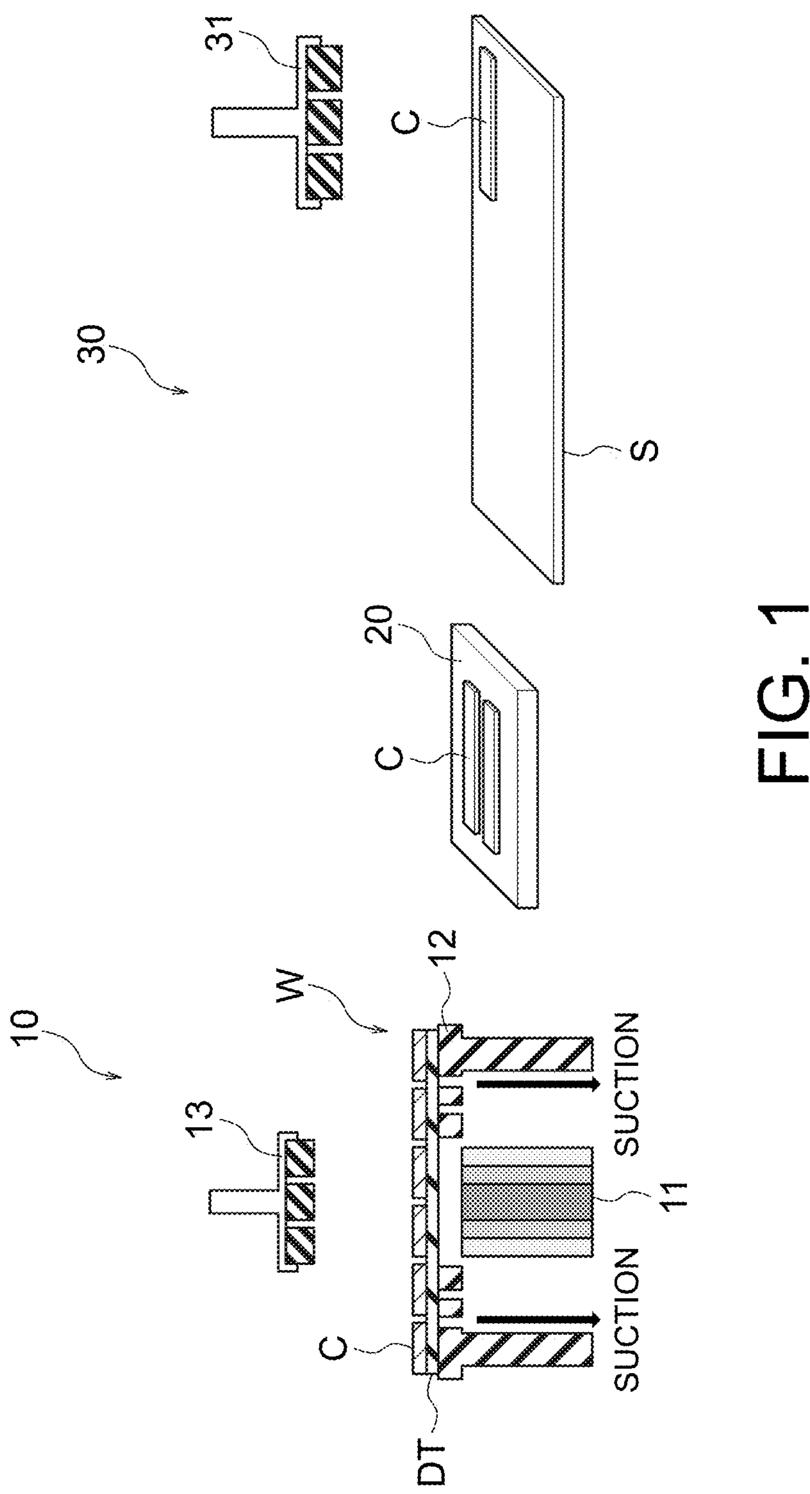
FIG. 1 is a block diagram illustrating an example of the configuration of a semiconductor manufacturing apparatus according to a first embodiment.

Embodiments will now be explained with reference to the accompanying drawings. The present invention is not limited to the embodiments. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the present specification and the drawings, elements identical to those described in the foregoing drawings are denoted by like reference characters and detailed explanations thereof are omitted as appropriate.

A semiconductor manufacturing apparatus according to the present embodiment includes a push-up device, a transfer device, an electronic component holding device, and a mounting device. The push-up device is capable of pushing up a plurality of adjacent electronic components among a plurality of electronic components diced from a wafer. The transfer device is capable of transferring the plurality of electronic components pushed up by the push-up device. The electronic component holding device is capable of holding the plurality of electronic components transferred by the transfer device. The mounting device mounts the electronic components held by the electronic component holding device onto a mounting target. At least part of the push-up device is capable of pushing up the plurality of adjacent electronic components by spanning the adjacent electronic components on the same surface. The electronic component holding device is capable of switching, for each of the electronic components, a holding state of the electronic component and a non-holding state of the electronic component.

First Embodiment

FIG. 1 is a block diagram illustrating an example of the configuration of a semiconductor manufacturing apparatus according to a first embodiment. The semiconductor manufacturing apparatus includes a pick-up device 10, a preciser 20, and a mounting device 30.

The pick-up device 10 picks up diced electronic components from a dicing tape DT. In the following description, electronic components are semiconductor chips C. However, electronic components are not limited to semiconductor chips C.

The pick-up device 10 includes a push-up mechanism 11, a wafer holding device 12, and a transfer head 13.

The push-up mechanism 11 (push-up device) is capable of pushing up adjacent semiconductor chips C among a plurality of semiconductor chips C diced from a semiconductor wafer W. The push-up mechanism 11 is moved to below the semiconductor chips C as pick-up targets (push-up targets) and pushes the semiconductor chips C and the dicing tape upward from below.

The push-up mechanism 11 includes a plurality of push-up members 111, 112, and 113. Accordingly, a multi-stage push-up scheme is employed. Details of the push-up members 111, 112, and 113 will be described later with reference to FIG. 2.

The wafer holding device 12 is disposed around the push-up mechanism 11 and holds semiconductor chips C around semiconductor chips C pushed up by the push-up mechanism 11. The wafer holding device 12 has suction holes for sucking a back surface of the dicing tape DT and is connected to a non-illustrated vacuum pump. The wafer holding device 12 holds semiconductor chips C around semiconductor chips C as push-up targets by suction.

The transfer head 13 (transfer device) picks up and transfers a plurality of semiconductor chips C pushed up by the push-up mechanism 11. The transfer head 13 includes, for example, a suction collet that sucks semiconductor chips C.

The preciser 20 (electronic component holding device) is capable of holding a plurality of semiconductor chips C transferred by the transfer head 13, with the semiconductor chips C placed thereon. The preciser 20 holds semiconductor chips C by, for example, suction. With the preciser 20, it is possible to independently perform pick-up operation and mounting operation of semiconductor chips C. Accordingly, process times necessary for pick-up and mounting can be shortened.

The preciser 20 is capable of switching, for each semiconductor chip C, a holding state of the semiconductor chip C and a non-holding state of the semiconductor chip C. The preciser 20 includes a plurality of suction devices (not illustrated) each capable of independently sucking a semiconductor chip C. Accordingly, suction (holding) can be switched for each semiconductor chip C. The suctions (for example, suction holes) are connected to a non-illustrated vacuum pump.

The mounting device 30 places semiconductor chips C onto a mounting target. In the following description, the mounting target is a wiring substrate S. However, the mounting target is not limited to the wiring substrate S.

The mounting device 30 includes a mounting head 31.

The mounting head 31 (mounting device) mounts semiconductor chips C held by the preciser 20 onto the wiring substrate S. More specifically, the mounting head 31 mounts semiconductor chips C onto the wiring substrate S one by one from at least one semiconductor chip C held by the preciser 20. The mounting head 31 includes, for example, a suction collet that sucks semiconductor chips C.

Details of the configuration of the push-up mechanism 11 will be described below.

Figure 2:
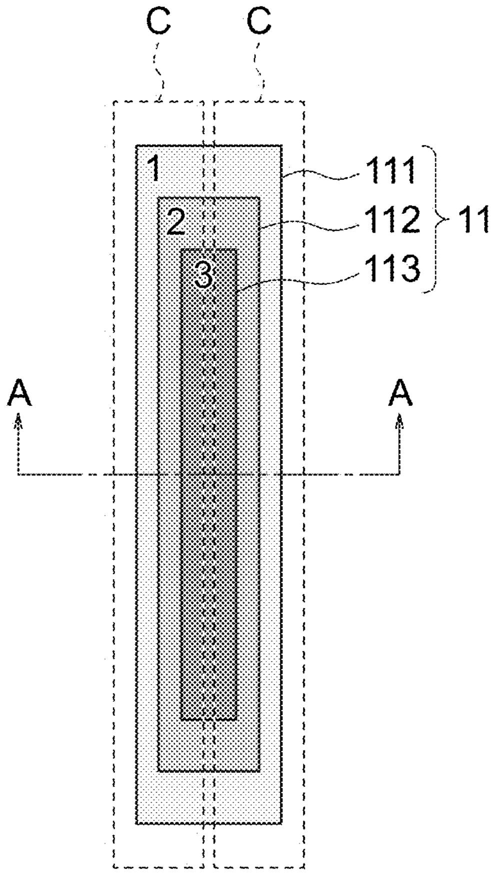
FIG. 2 is a top view illustrating an example of the configuration of a push-up mechanism according to the first embodiment.

FIG. 2 is a top view illustrating an example of the configuration of the push-up mechanism 11 according to the first embodiment. FIG. 2 also illustrates semiconductor chips C. Line A-A in FIG. 2 indicates a section corresponding to a cross sectional view of the push-up mechanism 11 in FIG. 1.

At least part of the push-up mechanism 11 is capable of pushing up a plurality of adjacent semiconductor chips C by spanning the adjacent semiconductor chips C on the same surface. Accordingly, the plurality of semiconductor chips C (two semiconductor chips C) can be simultaneously picked up.

The push-up mechanism 11 includes the plurality of push-up members 111, 112, and 113. The push-up members 111, 112, and 113 correspond to push-up members "1", "2", and "3", respectively, illustrated in FIG. 2. The number of push-up members is not limited to three.

The push-up members 111, 112, and 113 can each individually (independently) move up and down.

The push-up member 113 has, for example, a quadrilateral shape when viewed in a direction substantially orthogonal to the semiconductor wafer W and is disposed at the center. The push-up member 112 is disposed surrounding the push-up member 113, for example. The push-up member 111 is disposed surrounding the push-up member 112, for example.

Each semiconductor chip C has, for example, a quadrilateral shape when viewed in the direction substantially orthogonal to the semiconductor wafer W.

The following describes a semiconductor apparatus manufacturing method.

FIGS. 3A to 3F are diagrams illustrating an example of the semiconductor apparatus manufacturing method according to the first embodiment.

Figures 3A, 3B:
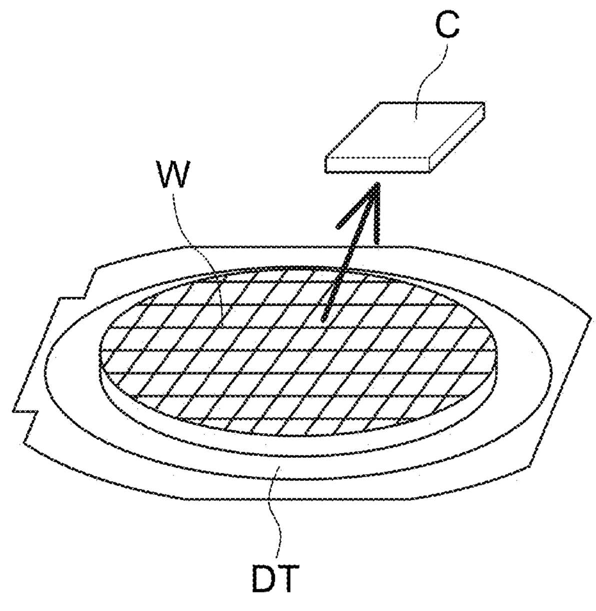
FIG. 3A is a diagram illustrating an example of a semiconductor apparatus manufacturing method according to the first embodiment.
FIG. 3B is a diagram illustrating the example of the semiconductor apparatus manufacturing method, following FIG. 3A.

First, as illustrated in FIG. 3A, the semiconductor wafer W is diced into a plurality of semiconductor chips C. The semiconductor wafer W is diced while adhering to the dicing tape DT through a bonding layer A.

Subsequently, as illustrated in FIG. 3B, the wafer holding device 12 holds semiconductor chips C around semiconductor chips C as push-up targets. The holding of semiconductor chips C is performed through suction by the wafer holding device 12.

Figure 3C:
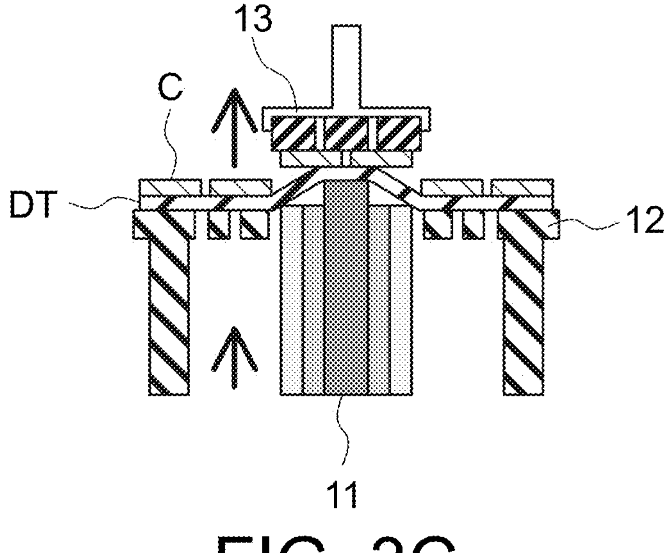
FIG. 3C is a diagram illustrating the example of the semiconductor apparatus manufacturing method, following FIG. 3B.

Subsequently, as illustrated in FIG. 3C, the push-up mechanism 11 pushes up the semiconductor chips C as push-up targets, and the transfer head 13 sucks and picks up the semiconductor chips C. In an example illustrated in FIG. 3C, the number of semiconductor chips C as push-up targets is two. Details of operation of the push-up mechanism 11 will be described later with reference to FIG. 4.

Figure 3D:
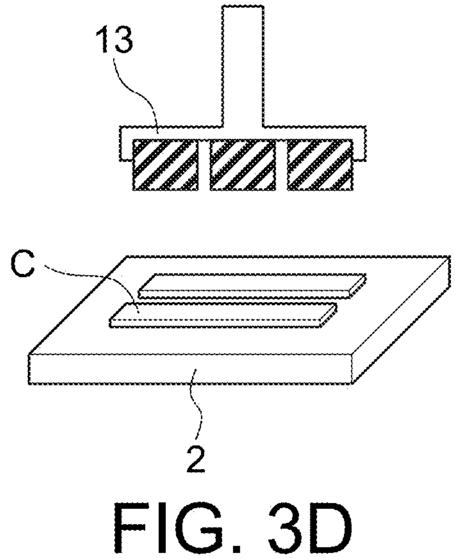
FIG. 3D is a diagram illustrating the example of the semiconductor apparatus manufacturing method, following FIG. 3C.

Subsequently, as illustrated in FIG. 3D, the transfer head 13 transfers the two semiconductor chips C onto the preciser 20. The transfer of semiconductor chips C is performed by the transfer head 13 simultaneously for the two semiconductor chips C.

Figures 3E, 3F:
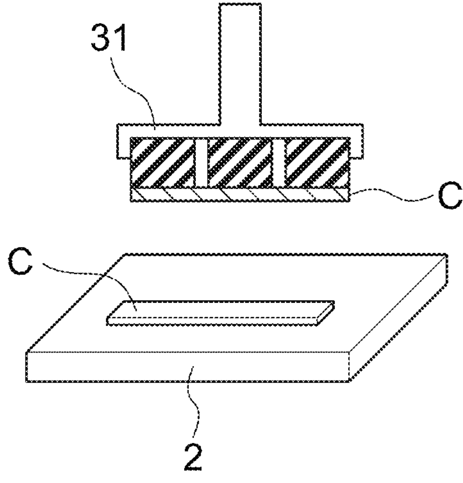
FIG. 3E is a diagram illustrating the example of the semiconductor apparatus manufacturing method, following FIG. 3D.
FIG. 3F is a diagram illustrating the example of the semiconductor apparatus manufacturing method, following FIG. 3E.

Subsequently, as illustrated in FIG. 3E, the mounting head 31 sucks one semiconductor chip C. The preciser 20 stops the suction (holding) of the semiconductor chip C by the mounting head 31.

Subsequently, as illustrated in FIG. 3F, the one semiconductor chip C is mounted onto the wiring substrate S.

Thereafter, the same processes as in FIGS. 3E and 3F are performed for the other semiconductor chip C. In other words, the mounting head 31 mounts semiconductor chips C one by one.

Details of operation of the push-up mechanism 11 in the process of FIG. 3C will be described below.

Figure 4:
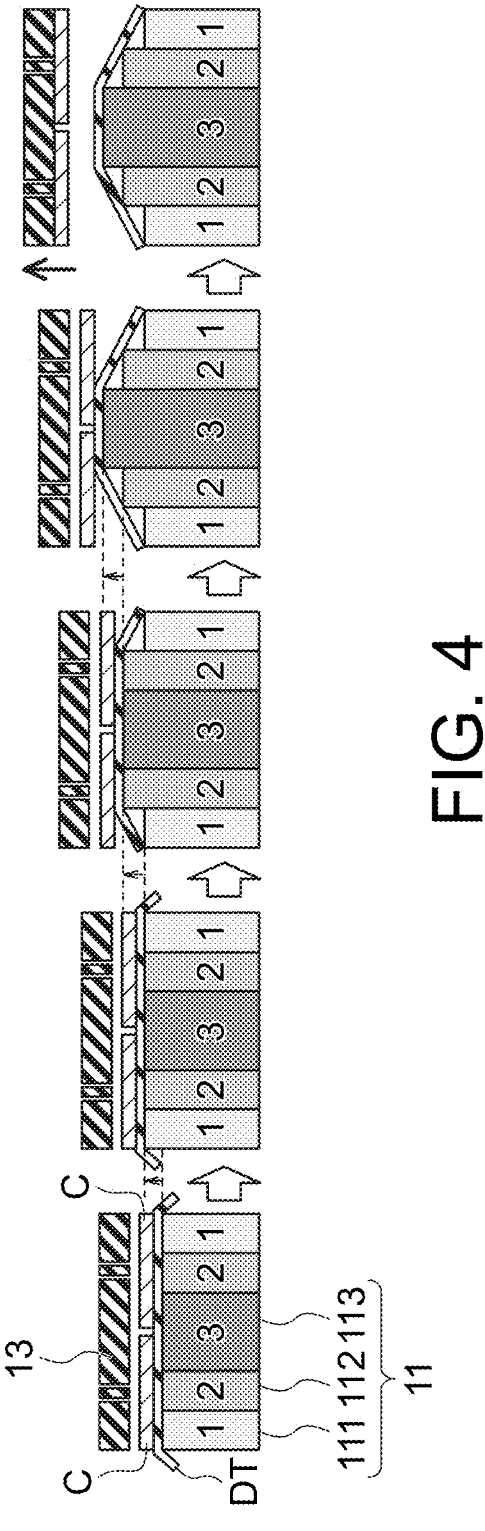
FIG. 4 is a cross sectional view illustrating an example of operation of the push-up mechanism according to the first embodiment.

FIG. 4 is a cross sectional view illustrating an example of operation of the push-up mechanism 11 according to the first embodiment. The push-up members 111, 112, and 113 correspond to push-up members “1”, “2”, and “3”, respectively, illustrated in FIG. 4. In FIG. 4, the collet of the transfer head 13 is illustrated as the transfer head 13.

The push-up member 111 on the right and left sides pushes up two semiconductor chips C on the same surface (refer to FIG. 2). The push-up member 112 on the right and left sides pushes up two semiconductor chips C on the same surface (refer to FIG. 2).

First, as illustrated in (a) of FIG. 4, the transfer head 13 sucks two semiconductor chips C. The push-up members 111, 112, and 113 all have the same height before pushing up.

Subsequently, as illustrated in (b) of FIG. 4, all push-up members 111, 112, and 113 move up and push up the semiconductor chips C. The push-up members 111, 112, and 113 all have the same height.

Subsequently, as illustrated in (c) of FIG. 4, the push-up members 112 and 113 move up and push up the semiconductor chips C. Accordingly, the dicing tape DT around the push-up member 112 peels off the semiconductor chips C.

Subsequently, as illustrated in (d) of FIG. 4, the push-up member 113 moves up and pushes up the semiconductor chips C. Accordingly, the dicing tape DT around the push-up member 113 peels off the semiconductor chips C. In this manner, the dicing tape DT gradually peels off the semiconductor chips C from the outer side of the push-up mechanism 11.

Subsequently, as illustrated in (e) of FIG. 4, the transfer head 13 moves up and picks up the two semiconductor chips C.

The following describes the semiconductor apparatus manufacturing method after semiconductor chips C are mounted on the wiring substrate S.

FIGS. 5A to 5D are diagrams illustrating an example of the semiconductor apparatus manufacturing method according to the first embodiment.

Figure 5A:
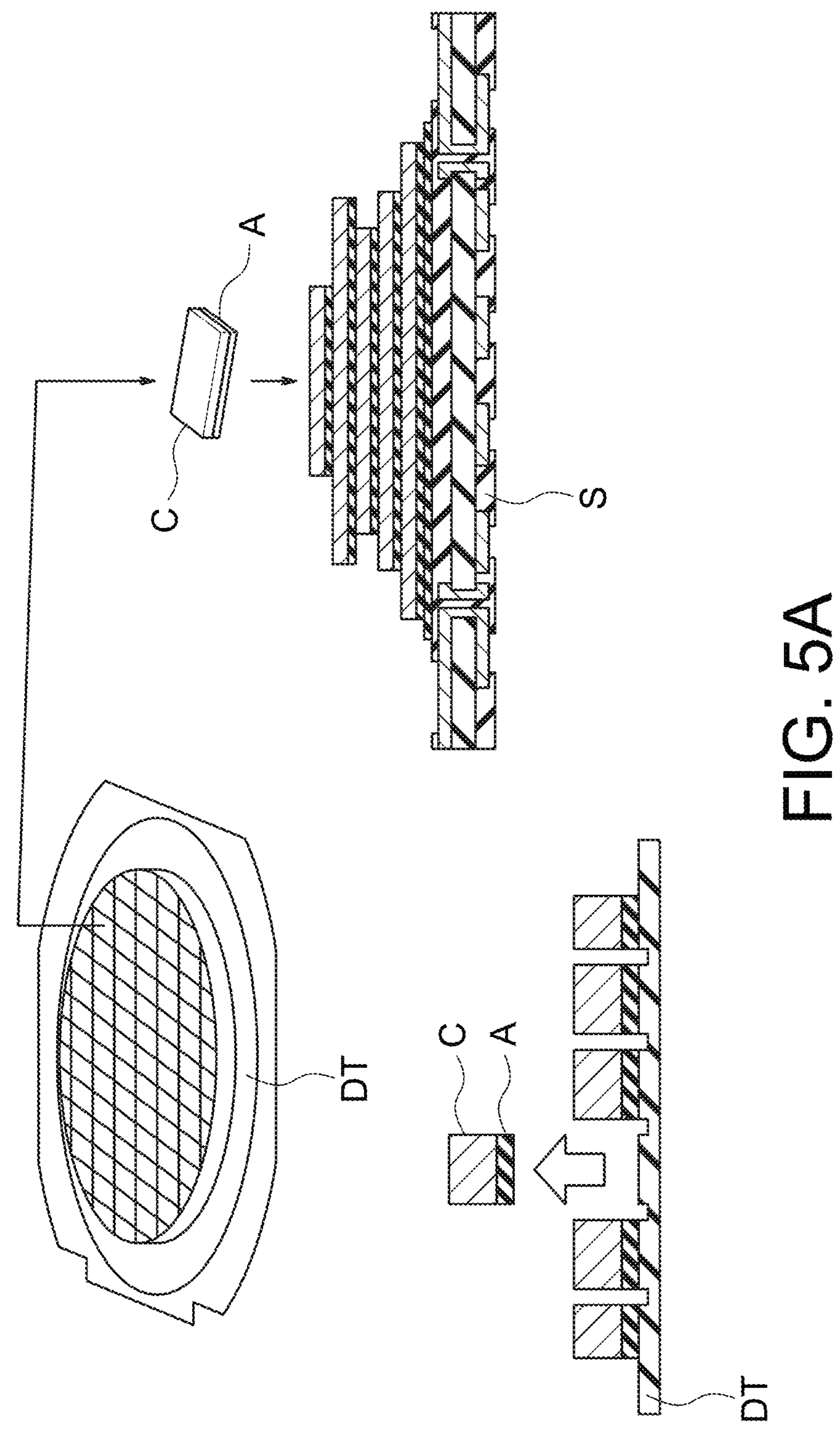
FIG. 5A is a diagram illustrating the example of the semiconductor apparatus manufacturing method according to the first embodiment.

First, as illustrated in FIG. 5A, diced semiconductor chips C are picked up and mounted on the wiring substrate S. The pick-up and mounting of semiconductor chips C are performed through the processes illustrated in FIGS. 3A to 3F. In the example illustrated in FIG. 5A, the bonding layer A is illustrated below the semiconductor chips C. In addition, a plurality of semiconductor chips C stacked in a direction substantially orthogonal to the wiring substrate S are illustrated.

Figure 5B:
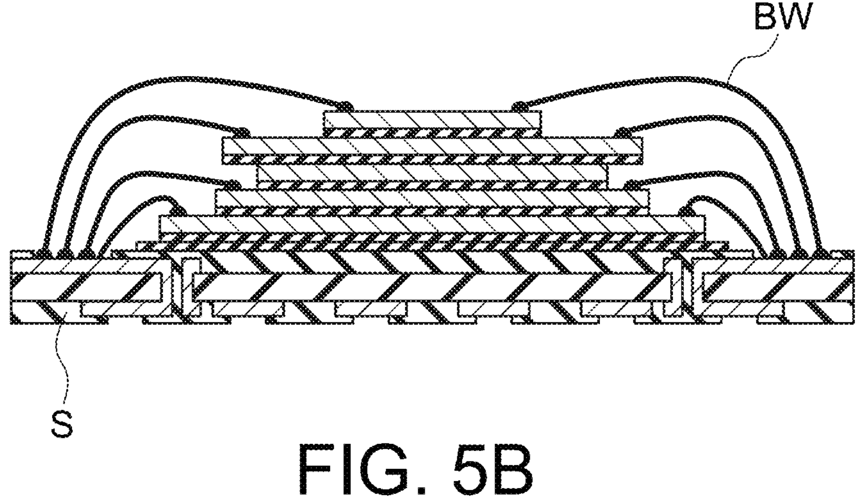
FIG. 5B is a diagram illustrating the example of the semiconductor apparatus manufacturing method, following FIG. 5A.

Subsequently, as illustrated in FIG. 5B, bonding wires BW electrically connecting the wiring substrate S and the semiconductor chips C are formed.

Figure 5C:
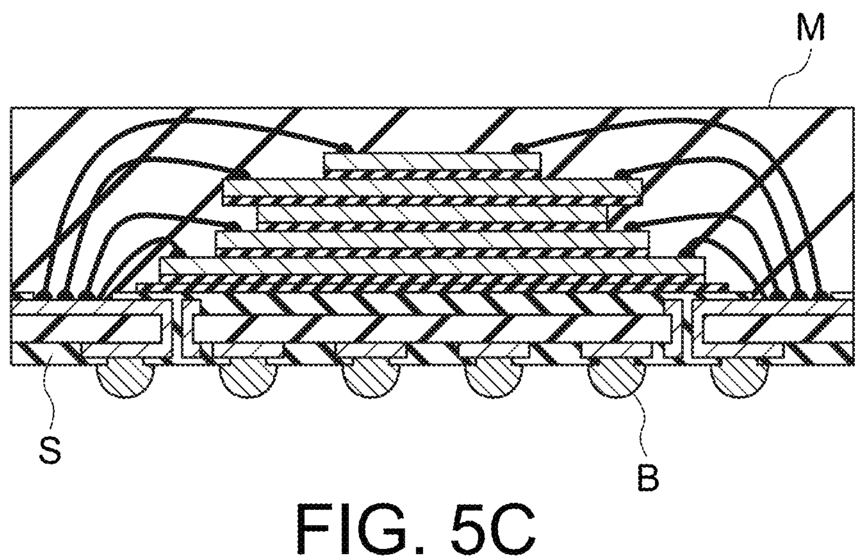
FIG. 5C is a diagram illustrating the example of the semiconductor apparatus manufacturing method, following FIG. 5B.

Subsequently, as illustrated in FIG. 5C, a molding resin M that covers the semiconductor chips C and the bonding wires BW is formed on the wiring substrate S. In addition, metal bumps B are formed on a lower surface of the wiring substrate S. The metal bumps B are, for example, solder balls.

Figure 5D:
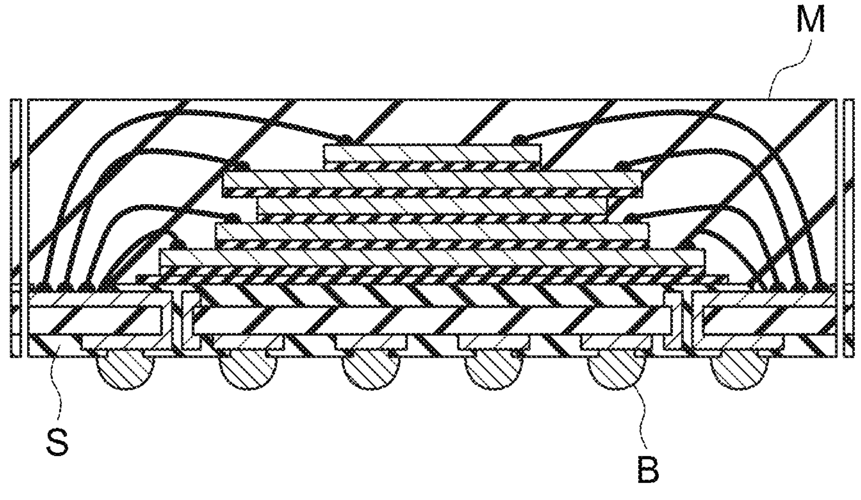
FIG. 5D is a diagram illustrating the example of the semiconductor apparatus manufacturing method, following FIG. 5C.

Subsequently, as illustrated in FIG. 5D, dicing is performed. Accordingly, a semiconductor apparatus as one semiconductor package is completed.

As described above, according to the first embodiment, at least part of the push-up mechanism 11 is capable of pushing up a plurality of adjacent semiconductor chips C by spanning the adjacent semiconductor chips C on the same surface. The preciser 20 is capable of switching, for each semiconductor chip C, the holding state of the semiconductor chip C and the non-holding state of the semiconductor chip C. Accordingly, a thin semiconductor chip C with a high aspect ratio can be more appropriately picked up. Moreover, time taken for pick-up is shortened and thus throughput improves.

Each semiconductor chip C has a thickness of, for example, 60 μm or smaller in the direction substantially orthogonal to the semiconductor wafer W. Each semiconductor chip C has a short side, for example, equal to or shorter than 3.0 mm.

COMPARATIVE EXAMPLE

Figure 6A:
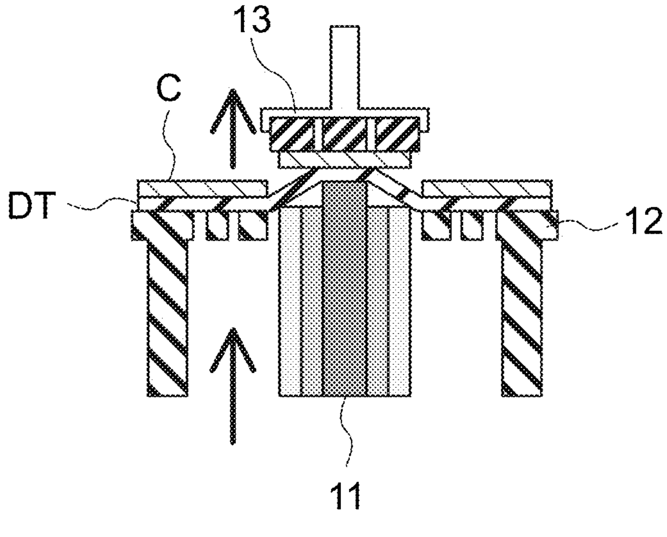
FIG. 6A is a diagram illustrating an example of a semiconductor apparatus manufacturing method according to a comparative example.
Figure 6B:
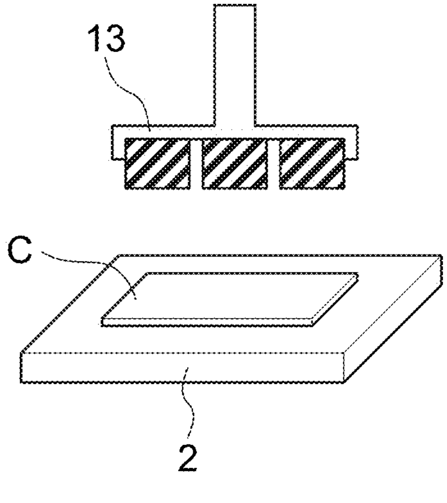
FIG. 6B is a diagram illustrating the example of the semiconductor apparatus manufacturing method, following FIG. 6A.

FIGS. 6A and 6B are diagrams illustrating an example of a semiconductor apparatus manufacturing method according to a comparative example. The comparative example is different from the first embodiment in that one semiconductor chip is picked up.

After semiconductor chips C are held by the wafer holding device 12 (refer to FIG. 3B), the push-up mechanism 11 pushes up the semiconductor chips C one by one and the transfer head 13 picks up the semiconductor chips C one by one as illustrated in FIG. 6A.

Subsequently, as illustrated in FIG. 6B, the transfer head 13 transfers the semiconductor chips C onto the preciser 20 one by one. The preciser 20 sucks only one semiconductor chip C. The mounting head 31 recognizes only one semiconductor chip C on the preciser 20.

In a case where thin chips (for example, 60 μm or smaller) are picked up, it is effective to employ the multi-stage push-up scheme. However, in a case where each semiconductor chip C has a large (for example, vertical/horizontal=4 or more) aspect ratio and is narrow, it is difficult to produce the push-up members (jigs) 111, 112, and 113 for the multi-stage push-up scheme.

Furthermore, in a case where the aspect ratio is large but semiconductor chips C are thin, chip cracks potentially occur when the chips are picked up by a pin push-up scheme.

However, in the first embodiment, the push-up mechanism 11 simultaneously pushes up a plurality of semiconductor chips C. A plurality of semiconductor chips C arrayed in the short side direction are simultaneously picked up as one semiconductor chip C. Accordingly, the apparent aspect ratio of semiconductor chips C can be reduced. This makes it possible to pick up thin semiconductor chips C with a high aspect ratio without producing the push-up members 111, 112, and 113 (jig) along with change in the aspect ratio of semiconductor chips C. Moreover, throughput can be improved since a plurality of semiconductor chips C can be simultaneously picked up.

Second Embodiment

Figure 7:
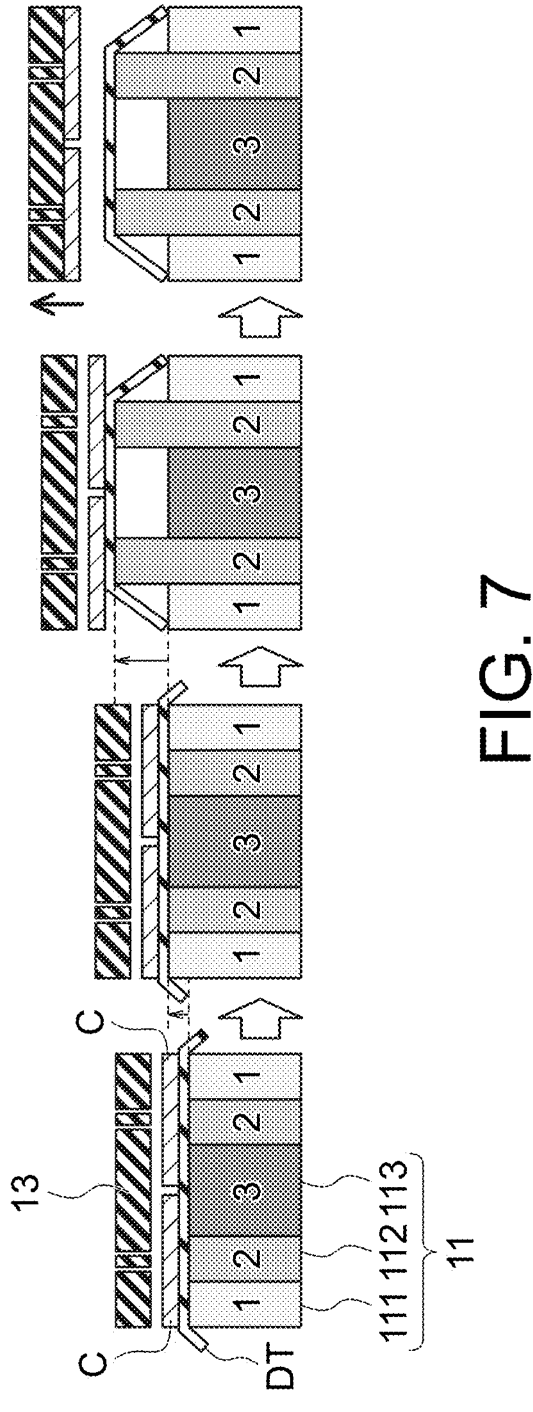
FIG. 7 is a cross sectional view illustrating an example of operation of the push-up mechanism according to a second embodiment.

FIG. 7 is a cross sectional view illustrating an example of operation of the push-up mechanism 11 according to a second embodiment. The second embodiment is different from the first embodiment in operation of the push-up mechanism 11.

First, as illustrated in (a) of FIG. 7, the transfer head 13 sucks two semiconductor chips C. The push-up members 111, 112, and 113 all have the same height before pushing up.

Subsequently, as illustrated in (b) of FIG. 7, all push-up members 111, 112, and 113 move up and push up the semiconductor chips C. The push-up members 111, 112, and 113 all have the same height.

Subsequently, as illustrated in (c) of FIG. 7, the push-up member 112 moves up and pushes up the semiconductor chips C. Accordingly, the dicing tape DT around the push-up member 112 peels off the semiconductor chips C.

Subsequently, as illustrated in (d) of FIG. 7, the transfer head 13 moves up and picks up the two semiconductor chips C.

Operation of the push-up mechanism 11 may be changed as in the second embodiment. In this case, as well, the same effects as in the first embodiment can be obtained.

Third Embodiment

Figure 8:
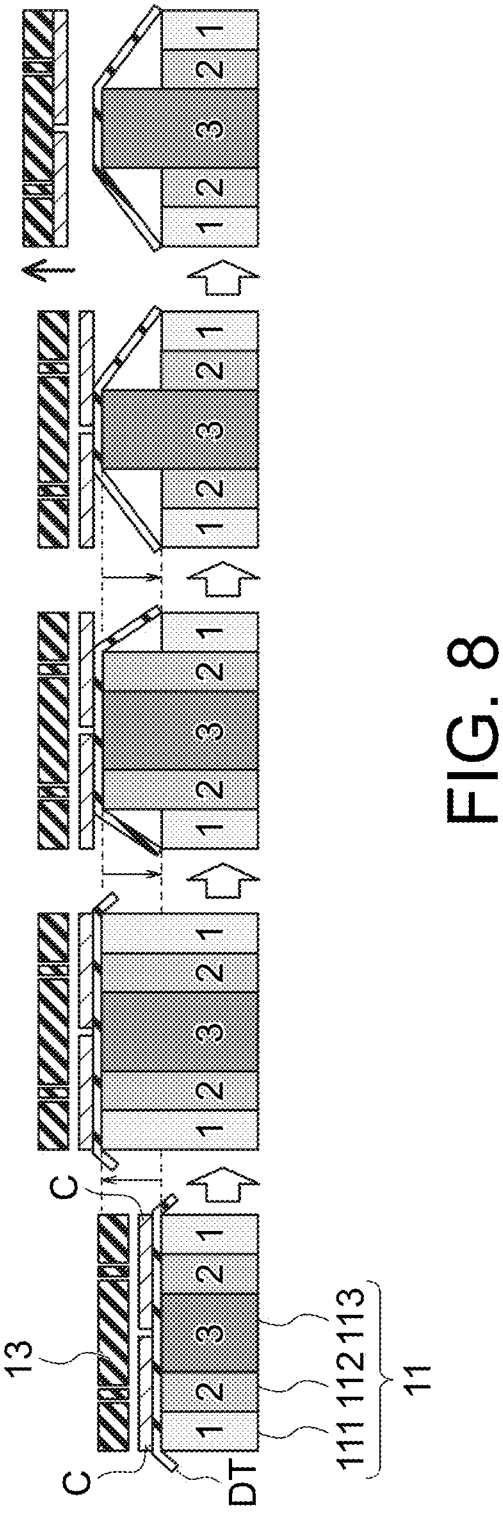
FIG. 8 is a cross sectional view illustrating an example of operation of the push-up mechanism according to a third embodiment.

FIG. 8 is a cross sectional view illustrating an example of operation of the push-up mechanism 11 according to a third embodiment. The third embodiment is different from the first embodiment in operation of the push-up mechanism 11.

First, as illustrated in (a) of FIG. 8, the transfer head 13 sucks two semiconductor chips C. The push-up members 111, 112, and 113 all have the same height before pushing up.

Subsequently, as illustrated in (b) of FIG. 8, all push-up members 111, 112, and 113 move up and push up the semiconductor chips C. The push-up members 111, 112, and 113 all have the same height.

Subsequently, as illustrated in (c) of FIG. 8, the push-up member 111 moves down. Accordingly, the dicing tape DT around the push-up member 112 peels off the semiconductor chips C.

Subsequently, as illustrated in (d) of FIG. 8, the push-up member 112 moves down. Accordingly, the dicing tape DT around the push-up member 113 peels off the semiconductor chips C. In this manner, the dicing tape DT gradually peels off the semiconductor chips C from the outer side of the push-up mechanism 11.

Subsequently, as illustrated in (e) of FIG. 8, the transfer head 13 moves up and picks up the two semiconductor chips C.

With the scheme of moving down in stages, stress is less likely to be applied on semiconductor chips C than with the scheme of moving up in stages. Thus, the scheme of moving down in stages is preferable in a case where thin semiconductor chips C are used.

Operation of the push-up mechanism 11 may be changed as in the third embodiment. In this case, as well, the same effects as in the first embodiment can be obtained.

Fourth Embodiment

Figure 9:
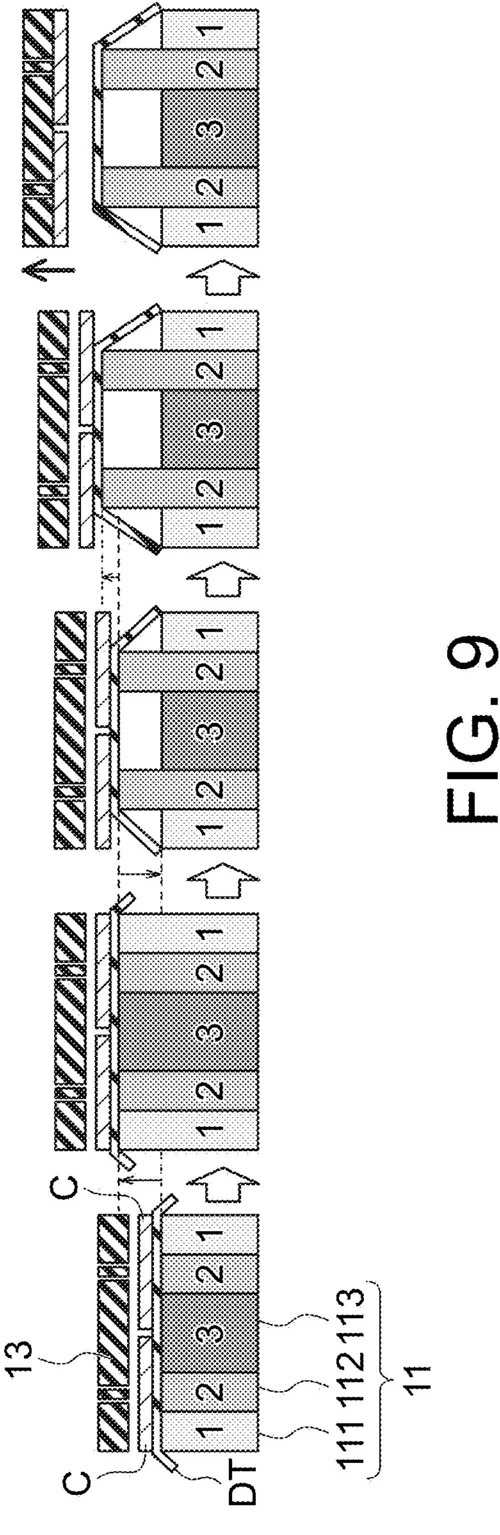
FIG. 9 is a cross sectional view illustrating an example of operation of the push-up mechanism according to a fourth embodiment.

FIG. 9 is a cross sectional view illustrating an example of operation of the push-up mechanism 11 according to a fourth embodiment. The fourth embodiment is different from the first embodiment in operation of the push-up mechanism 11.

First, as illustrated in (a) of FIG. 9, the transfer head 13 sucks two semiconductor chips C. The push-up members 111, 112, and 113 all have the same height before pushing up.

Subsequently, as illustrated in (b) of FIG. 9, all push-up members 111, 112, and 113 move up and push up the semiconductor chips C. The push-up members 111, 112, and 113 all have the same height.

Subsequently, as illustrated in (c) of FIG. 9, the push-up members 111 and 113 move down. Accordingly, the dicing tape DT around the push-up member 112 peels off the semiconductor chips C.

Subsequently, as illustrated in (d) of FIG. 9, the push-up member 112 moves up and pushes up the semiconductor chips C.

Subsequently, as illustrated in (e) of FIG. 9, the transfer head 13 moves up and picks up the two semiconductor chips C.

Operation of the push-up mechanism 11 may be changed as in the fourth embodiment. In this case, as well, the same effects as in the first embodiment can be obtained.

Fifth Embodiment

Figure 10:
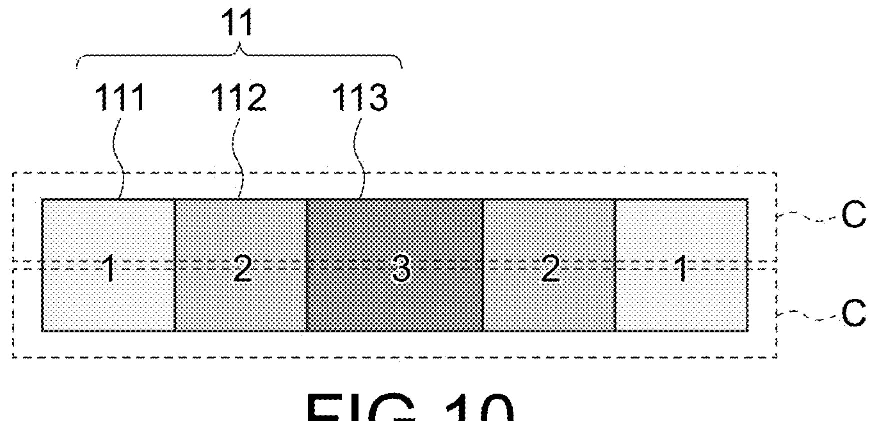
FIG. 10 is a top view illustrating an example of the configuration of the push-up mechanism according to a fifth embodiment.

FIG. 10 is a top view illustrating an example of the configuration of the push-up mechanism 11 according to a fifth embodiment. The fifth embodiment is different from the first embodiment in the configuration of the push-up mechanism 11.

The push-up member 113 has, for example, a quadrilateral shape when viewed in the direction substantially orthogonal to the semiconductor wafer W and is disposed at the center. Two push-up members 112 are disposed sandwiching the push-up member 113 in the long side direction of semiconductor chips C. Two push-up members 111 are disposed sandwiching the two push-up members 112 in the long side direction of semiconductor chips C.

The configuration of the push-up mechanism 11 may be changed as in the fifth embodiment. In this case, as well, the same effects as in the first embodiment can be obtained.

Sixth Embodiment

Figure 11:
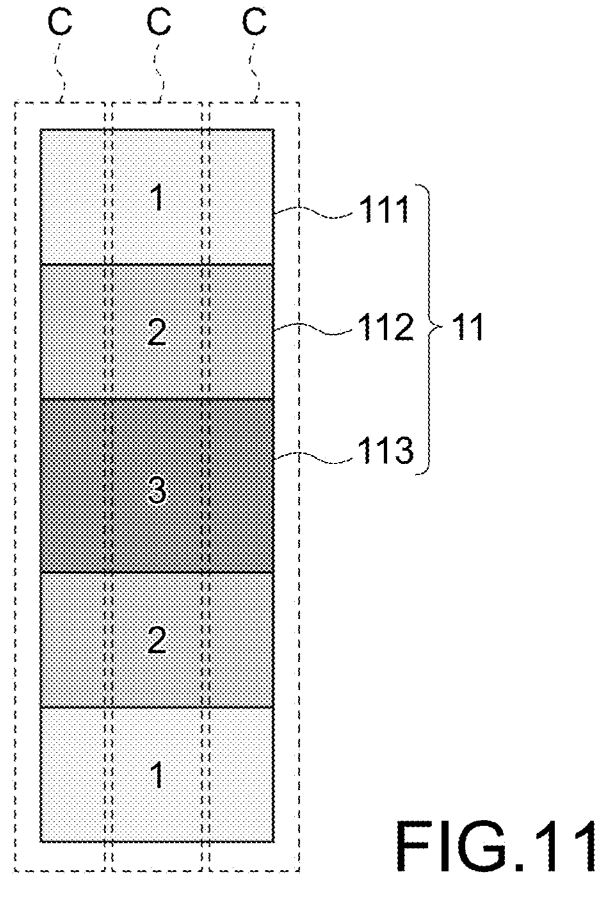
FIG. 11 is a top view illustrating an example of the configuration of the push-up mechanism according to a sixth embodiment.

FIG. 11 is a top view illustrating an example of the configuration of the push-up mechanism 11 according to a sixth embodiment. The sixth embodiment is different from the fifth embodiment in the number of semiconductor chips C pushed up by the push-up mechanism 11.

In the example illustrated in FIG. 11, the push-up mechanism 11 simultaneously pushes up 1×3 semiconductor chips C in the vertical and horizontal directions.

The number of semiconductor chips C pushed up by the push-up mechanism 11 may be changed as in the sixth embodiment. In this case, as well, the same effects as in the fifth embodiment can be obtained.

Seventh Embodiment

Figure 12:
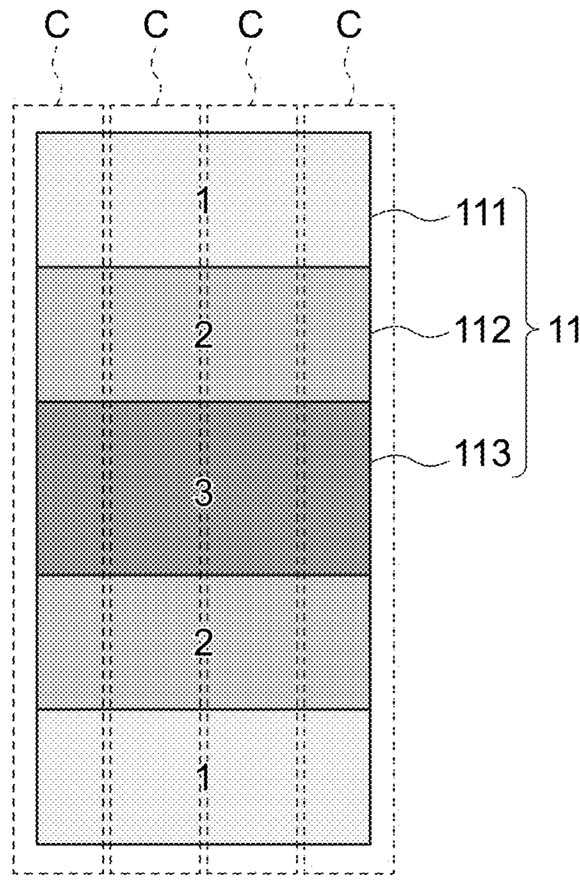
FIG. 12 is a top view illustrating an example of the configuration of the push-up mechanism according to a seventh embodiment.

FIG. 12 is a top view illustrating an example of the configuration of the push-up mechanism 11 according to a seventh embodiment. The seventh embodiment is different from the fifth embodiment in the number of semiconductor chips C pushed up by the push-up mechanism 11.

In the example illustrated in FIG. 12, the push-up mechanism 11 simultaneously pushes up 1×4 semiconductor chips C in the vertical and horizontal directions.

The number of semiconductor chips C pushed up by the push-up mechanism 11 may be changed as in the seventh embodiment. In this case, as well, the same effects as in the fifth embodiment can be obtained.

Eighth Embodiment

Figure 13:
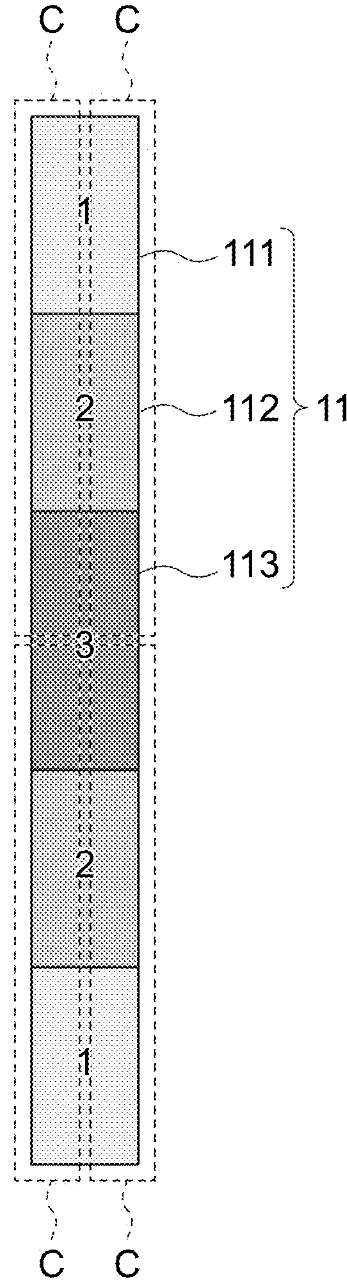
FIG. 13 is a top view illustrating an example of the configuration of the push-up mechanism according to an eighth embodiment.

FIG. 13 is a top view illustrating an example of the configuration of the push-up mechanism 11 according to an eighth embodiment. The eighth embodiment is different from the first embodiment in the number of semiconductor chips C pushed up by the push-up mechanism 11.

In the example illustrated in FIG. 13, the push-up mechanism 11 simultaneously pushes up 2×2 semiconductor chips C in the vertical and horizontal directions.

The number of semiconductor chips C pushed up by the push-up mechanism 11 may be changed as in the eighth embodiment. In this case, as well, the same effects as in the fifth embodiment can be obtained.

Ninth Embodiment

Figure 14:
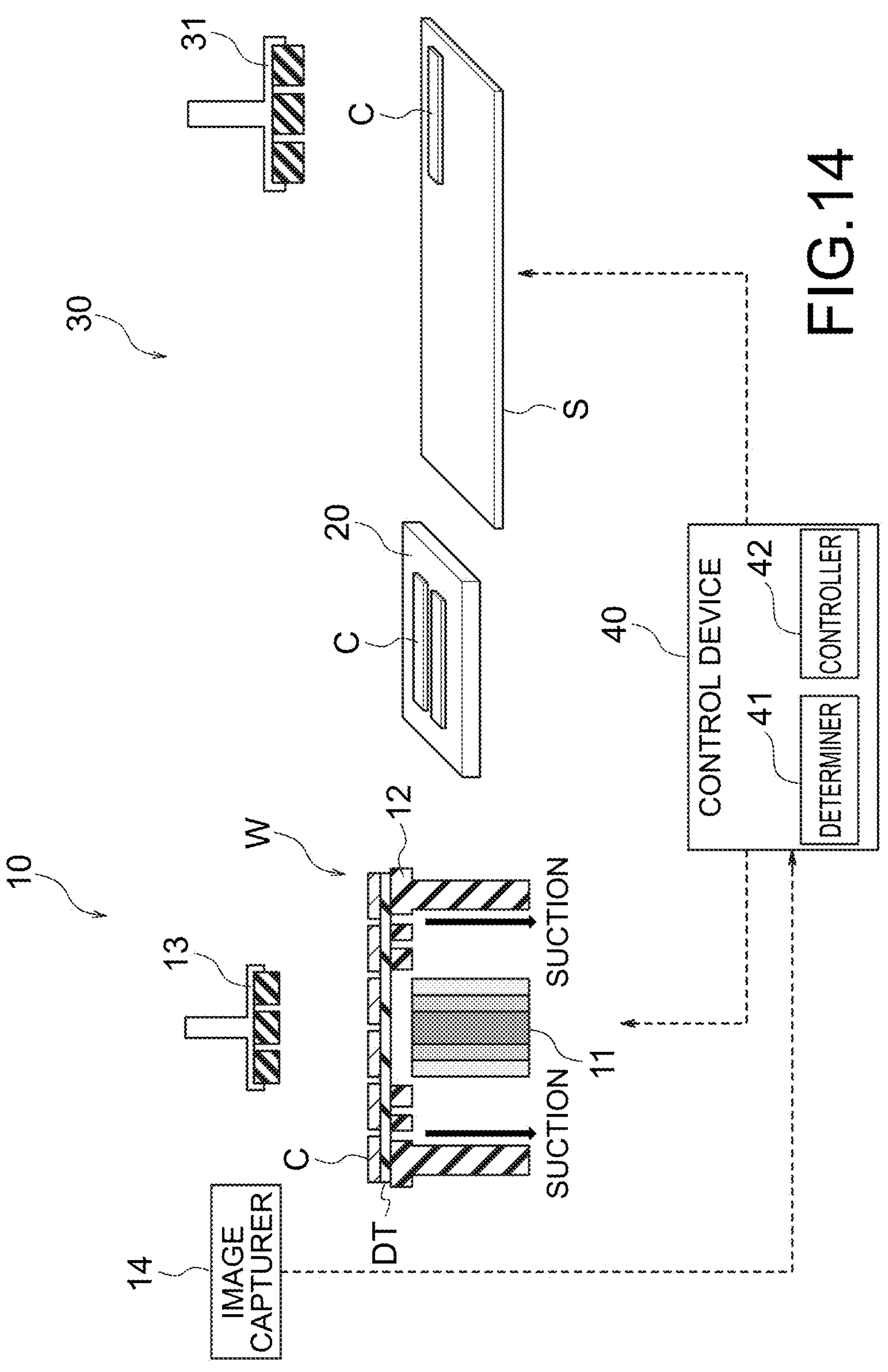
FIG. 14 is a block diagram illustrating an example of the configuration of a semiconductor manufacturing apparatus according to a ninth embodiment.

FIG. 14 is a block diagram illustrating an example of the configuration of the semiconductor manufacturing apparatus according to a ninth embodiment. The ninth embodiment is different from the first embodiment in that quality determination of semiconductor chips C is performed.

The pick-up device 10 further includes an image capturer 14.

The image capturer 14 captures an image of diced semiconductor chips C. The image capturer 14 is, for example, a camera.

The semiconductor manufacturing apparatus further includes a control device 40.

The control device 40 controls the pick-up device 10 and the mounting device 30.

The control device 40 includes a determiner 41 and a controller 42. The determiner 41 and the controller 42 may be provided in the image capturer 14.

The determiner 41 determines quality, existence, and the like of semiconductor chips C based on an image capturing result of the image capturer 14. Accordingly, the determiner 41 recognizes whether semiconductor chips C are non-defective or defective chips. The determiner 41 also recognizes existence of semiconductor chips C.

The controller 42 transmits control signals to the pick-up device and the mounting device 30 in accordance with a determination result of the determiner 41. Accordingly, the pick-up device 10 and the mounting device 30 can be operated differently depending on quality, existence, and the like of two semiconductor chips C as pick-up targets.

In a case where the determiner 41 recognizes that the two semiconductor chips C are non-defective chips, the pick-up device 10 sucks and conveys the two semiconductor chips C. Operation in this case is the same as operation described above in the first embodiment.

The following describes an operation example in a case where the determiner 41 recognizes that one of the semiconductor chips C is a non-defective chip and the other semiconductor chip C is a defective chip.

In a first operation example, the transfer head 13 sucks the two semiconductor chips C, conveys the non-defective chip to the preciser 20, and discards the defective chip right after pick-up (before conveyance to the preciser 20). The defective chip is discarded to, for example, a discard container. In other words, the transfer head 13 discards the semiconductor chip C pushed up by the push-up mechanism 11 and determined as defective by the determiner 41.

In a second operation example, the transfer head 13 sucks the two semiconductor chips C and conveys the two semiconductor chips C to the preciser 20. Thereafter, the mounting head 31 discards the defective chip. The defective chip is discarded to, for example, a discard container. In other words, the mounting head 31 discards the semiconductor chip C held by the preciser 20 and determined as defective by the determiner 41.

Figure 15:
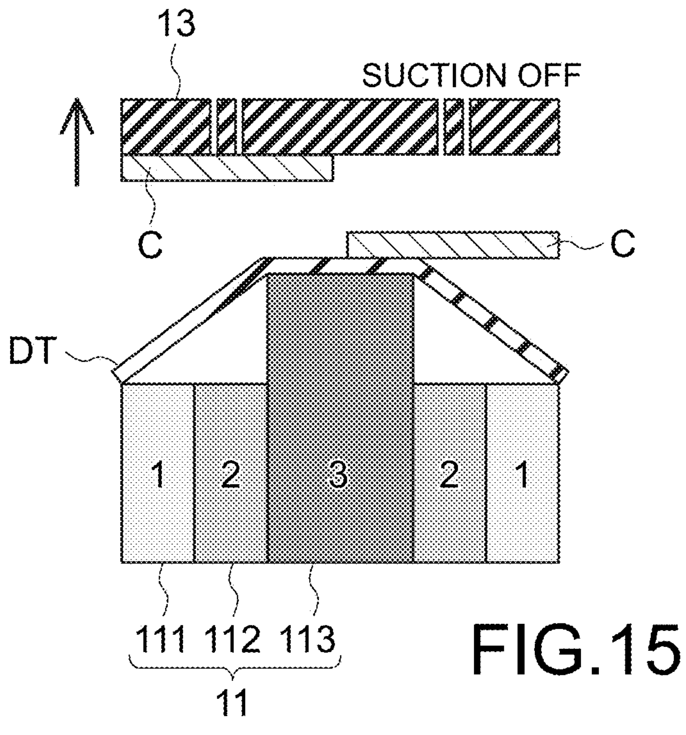
FIG. 15 is a cross sectional view illustrating an example of operation of the push-up mechanism according to a third operation example of the ninth embodiment.

FIG. 15 is a cross sectional view illustrating an example of operation of the push-up mechanism 11 according to a third operation example of the ninth embodiment.

The suction collet of the transfer head 13 has a plurality of independent suction holes.

The transfer head 13 transfers any semiconductor chip C determined as non-defective by the determiner 41 from among semiconductor chips C pushed up by the push-up mechanism 11, and does not transfer any semiconductor chip C determined as defective by the determiner 41 from among the pushed-up semiconductor chips C.

In the third operation example, the transfer head 13 turns off suction corresponding to the defective chip, and sucks the non-defective chip and conveys the non-defective chip to the preciser 20. In other words, the transfer head 13 keeps the defective chip remaining on the dicing tape DT. The push-up mechanism 11 pushes up the two semiconductor chips while the transfer head 13 is sucking the non-defective chip.

In the example illustrated in FIG. 15, the transfer head 13 turns on suction on the left side and turns off suction on the right side. The push-up mechanism 11 pushes up the two semiconductor chips C while the transfer head 13 is sucking the non-defective chip. Accordingly, the semiconductor chip C on the left side is transferred, and the semiconductor chip C on the right side is kept remaining on the dicing tape DT.

Figure 16:
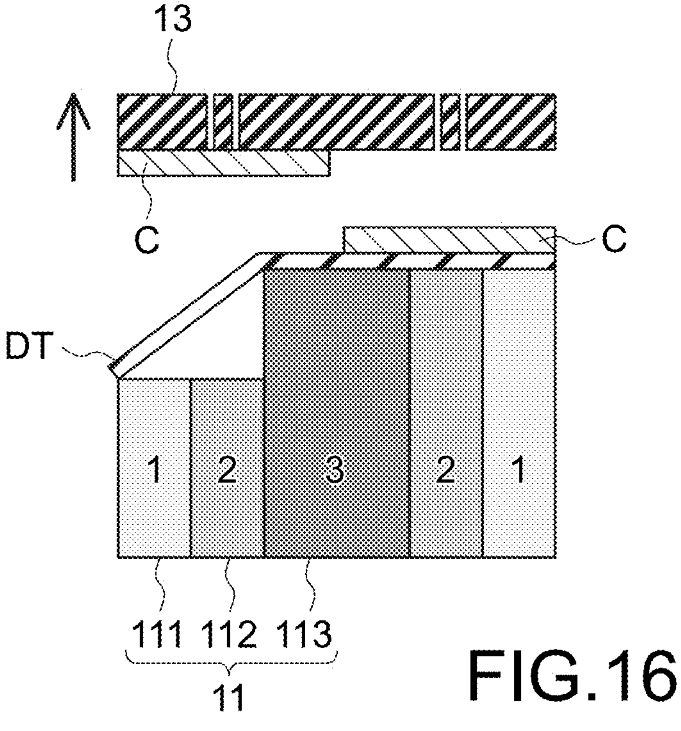
FIG. 16 is a cross sectional view illustrating an example of operation of the push-up mechanism according to a fourth operation example of the ninth embodiment.

FIG. 16 is a cross sectional view illustrating an example of operation of the push-up mechanism 11 according to a fourth operation example of the ninth embodiment.

The push-up mechanism 11 pushes up any semiconductor chip C determined as non-defective by the determiner 41 from among semiconductor chips C as push-up targets and does not push up any semiconductor chip C determined as defective by the determiner 41 from among the push-up targets. The push-up member 111 on the right side and the push-up member 111 on the left side can push up independently from each other. The push-up member 112 on the right side and the push-up member 112 on the left side can push up independently from each other.

In the fourth operation example, the push-up mechanism 11 pushes up semiconductor chips C in a right-left asymmetric manner. More specifically, the transfer head 13 sucks two semiconductor chips C, and the push-up mechanism 11 pushes up the two semiconductor chips. Thereafter, the push-up mechanism 11 moves down, sequentially from the outer periphery side, only the push-up member directly below a non-defective chip. In other words, a defective chip is kept remaining on the dicing tape DT. Thereafter, the transfer head 13 conveys the non-defective chip to the preciser 20. The transfer head 13 may turn off suction on the right side when the push-up member moves down.

In the example illustrated in FIG. 16, the push-up members 111 and 112 on the left side do not move up, but the push-up members 111 and 112 on the right side move up. Accordingly, the semiconductor chip C on the left side is transferred, and the semiconductor chip C on the right side is kept remaining on the dicing tape DT.

The following describes an operation example in a case where one semiconductor chip C is a non-defective chip and no semiconductor chip C is placed on the other side, in other words, the determiner 41 recognizes that a semiconductor chip C at an end part of the semiconductor wafer W is to be picked up.

In a fifth operation example, the transfer head 13 turns off suction on the side where no semiconductor chip C is placed, and conveys the non-defective chip.

In a sixth operation example, the push-up mechanism 11 performs push-up in a right-left asymmetric manner. Thereafter, the transfer head 13 sucks the non-defective chip and conveys the non-defective chip to the preciser 20.

In a case where the determiner 41 recognizes that two semiconductor chips C are defective chips, the two defective chips are not picked up. In other words, the push-up mechanism 11, the wafer holding device 12, and the transfer head 13 move to next two semiconductor chips C.

Quality determination of semiconductor chips C may be performed as in the ninth embodiment. In this case, as well, the same effects as in the first embodiment can be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:

a push-up device capable of pushing up a plurality of adjacent electronic components among a plurality of electronic components diced from a wafer;

a transfer device capable of transferring the plurality of electronic components pushed up by the push-up device;

an electronic component holding device capable of holding the plurality of electronic components transferred by the transfer device; and a mounting device configured to mount the electronic components held by the electronic component holding device onto a mounting target, wherein at least part of the push-up device is capable of pushing up the plurality of adjacent electronic components by spanning the adjacent electronic components on the same surface, and the electronic component holding device is capable of switching, for each of the electronic components, a holding state of the electronic component and a non-holding state of the electronic component.

2. The semiconductor manufacturing apparatus according to claim 1, wherein the mounting device mounts the electronic components onto the mounting target one by one from the at least one electronic component held by the electronic component holding device.

3. The semiconductor manufacturing apparatus according to claim 1, further comprising a determiner configured to determine quality of the electronic components.

4. The semiconductor manufacturing apparatus according to claim 3, wherein the transfer device transfers any electronic component determined as non-defective by the determiner from among the electronic components pushed up by the push-up device and does not transfer any electronic component determined as defective by the determiner from among the pushed-up electronic components.

5. The semiconductor manufacturing apparatus according to claim 3, wherein the push-up device pushes up any electronic component determined as non-defective by the determiner from among the electronic components as push-up targets and does not push up any electronic component determined as defective by the determiner from among the push-up targets.

6. The semiconductor manufacturing apparatus according to claim 5, wherein the push-up device asymmetrically pushes up the electronic components.

7. The semiconductor manufacturing apparatus according to claim 3, wherein the transfer device discards any electronic component pushed up by the push-up device and determined as defective by the determiner.

8. The semiconductor manufacturing apparatus according to claim 3, wherein the mounting device discards any electronic component held by the electronic component holding device and determined as defective by the determiner.

9. The semiconductor manufacturing apparatus according to claim 1, wherein the electronic components have a thickness of 60 μm or smaller in a first direction substantially orthogonal to the wafer, the electronic components have a quadrilateral shape when viewed in the first direction, and the electronic components have a short side equal to or shorter than 3.0 mm.

10. The semiconductor manufacturing apparatus according to claim 1, further comprising a wafer holding device configured to hold the electronic components around the electronic components pushed up by the push-up device.

11. The semiconductor manufacturing apparatus according to claim 1, wherein the electronic components are semiconductor chips, and the mounting target is a wiring substrate.

12. The semiconductor manufacturing apparatus according to claim 2, further comprising a determiner configured to determine quality of the electronic components.

13. The semiconductor manufacturing apparatus according to claim 12, wherein the transfer device transfers any electronic component determined as non-defective by the determiner from among the electronic components pushed up by the push-up device and does not transfer any electronic component determined as defective by the determiner from among the pushed-up electronic components.

14. The semiconductor manufacturing apparatus according to claim 12, wherein the push-up device pushes up any electronic component determined as non-defective by the determiner from among the electronic components as push-up targets and does not push up any electronic component determined as defective by the determiner from among the push-up targets.

15. The semiconductor manufacturing apparatus according to claim 14, wherein the push-up device asymmetrically pushes up the electronic components.

16. The semiconductor manufacturing apparatus according to claim 12, wherein the transfer device discards any electronic component pushed up by the push-up device and determined as defective by the determiner.

17. The semiconductor manufacturing apparatus according to claim 12, wherein the mounting device discards any electronic component held by the electronic component holding device and determined as defective by the determiner.

* * * * *